(12) United States Patent
Berthelot et al.

(10) Patent No.: US 10,472,227 B2
(45) Date of Patent: Nov. 12, 2019

(54) MICRO-DEVICE HAVING A PLURALITY OF MOBILE ELEMENTS ARRANGED IN A PLURALITY OF EMBEDDED CAVITIES

(71) Applicants: COMMISSARIAT A L'ENERGIE ATOMIQUE ET AUX ENERGIES ALTERNATIVES, Paris (FR); SAFRAN, Paris (FR)

(72) Inventors: Audrey Berthelot, Saint-Ismier (FR); Mikael Colin, Grenoble (FR)

(73) Assignees: COMMISSARIAT A L'ENERGIE ATOMIQUE ET AUX ENERGIES ALTERNATIVES, Paris (FR); SAFRAN, Paris (FR)

( * ) Notice: Subject to any disclaimer, the term of this patent is extended or adjusted under 35 U.S.C. 154(b) by 0 days.

(21) Appl. No.: 15/918,008

(22) Filed: Mar. 12, 2018

(65) Prior Publication Data
US 2018/0265348 A1 Sep. 20, 2018

(30) Foreign Application Priority Data
Mar. 16, 2017 (FR) .................................. 17 52157

(51) Int. Cl.
*B81B 7/00* (2006.01)
*B81B 7/02* (2006.01)
*B81C 1/00* (2006.01)

(52) U.S. Cl.
CPC ............. *B81B 7/0038* (2013.01); *B81B 7/02* (2013.01); *B81C 1/00285* (2013.01);
(Continued)

(58) Field of Classification Search
CPC . B81B 7/0038; B81B 7/02; B81B 2203/0315; B81B 2203/0136;
(Continued)

(56) References Cited

U.S. PATENT DOCUMENTS

| 5,543,956 A * | 8/1996 | Nakagawa ........... G02B 26/085 310/36 |
| 2005/0035682 A1* | 2/2005 | Tsuboi ................... H02N 1/008 310/309 |

(Continued)

OTHER PUBLICATIONS

French Preliminary Search Report dated Nov. 17, 2017 in French Application 17 52157 filed Mar. 16, 2017 (with English Translation of Categories of Cited Documents).

*Primary Examiner* — Yosef Gebreyesus
(74) *Attorney, Agent, or Firm* — Oblon, McClelland, Maier & Neustadt, L.L.P.

(57) ABSTRACT

A micro-device comprising:
a substrate,
a stationary element rigidly connected to the substrate,
a first mobile element suspended from the stationary element by first retention elements and configured to move with respect to the stationary element,
a second mobile element suspended from the first mobile element by second retention elements and configured to move with respect to the first mobile element and the stationary element,
a first cavity, at least some of the walls of which are formed by the stationary element and in which the first mobile element is encapsulated,
a second cavity positioned in the first cavity, at least some of the walls of which are formed by the first mobile element, in which the second mobile element is encapsulated and which is insulated from the first cavity.

20 Claims, 6 Drawing Sheets

(52) U.S. Cl.
CPC . *B81B 2201/025* (2013.01); *B81B 2203/0136* (2013.01); *B81B 2203/0315* (2013.01); *B81C 2201/0105* (2013.01); *B81C 2203/019* (2013.01)

(58) Field of Classification Search
CPC .......... B81B 2201/025; B81C 1/00285; B81C 2203/019; B81C 2201/0105
See application file for complete search history.

(56) References Cited

U.S. PATENT DOCUMENTS

| | | | |
|---|---|---|---|
| 2005/0170656 A1* | 8/2005 | Nasiri | B81C 1/00238 |
| | | | 438/700 |
| 2006/0208326 A1 | 9/2006 | Nasiri et al. | |
| 2006/0284514 A1 | 12/2006 | Ko et al. | |
| 2008/0136000 A1 | 6/2008 | Fischer et al. | |
| 2010/0025845 A1 | 2/2010 | Merz et al. | |
| 2012/0230079 A1 | 9/2012 | Li et al. | |
| 2012/0299127 A1* | 11/2012 | Fujii | B60C 23/0488 |
| | | | 257/415 |
| 2013/0127879 A1* | 5/2013 | Burns | G01L 9/0051 |
| | | | 345/501 |
| 2017/0240417 A1* | 8/2017 | Yamada | B81B 7/0038 |
| 2017/0339494 A1* | 11/2017 | Perletti | B81C 1/00158 |

* cited by examiner

MICRO-DEVICE HAVING A PLURALITY OF MOBILE ELEMENTS ARRANGED IN A PLURALITY OF EMBEDDED CAVITIES

TECHNICAL FIELD AND PRIOR ART

This document relates to the field of micro-devices, in particular that of micro-devices such as microelectromechanical systems (MEMS) and/or nanoelectromechanical systems (NEMS) and/or micro-opto-electro-mechanical systems (MOEMS) and/or nano-opto-electro-mechanical systems (NOEMS), comprising mobile portions capable of moving, under the effect of an outside action (mechanical, electrical, magnetic), with respect to a stationary portion of the device. Hereinafter, the term "micro-device" is used to designate in particular a MEMS and/or NEMS and/or MOEMS and/or NOEMS device.

The micro-devices are generally made by implementing conventional techniques of collective etching of a wafer of semiconductor material (for example of silicon). They are small and not costly to manufacture. The fields of use can be very diverse, from consumer products to very specific fields of use.

In order for them to operate correctly, these micro-devices are packaged. At present, the most used packaging technique in the field of micro-devices is WLP ("Wafer Level Packaging"), in which the micro-devices made on the same substrate are collectively packaged before cutting up of the substrate that separates the micro-devices from each other. A first substrate on which the micro-devices are made is placed in contact and then sealed with a second substrate forming covers of cavities in which the micro-devices are located. This sealing allows the micro-devices to be collectively encapsulated under a controlled atmosphere and provides impermeability of the cavities thus obtained. This rigid connection of the two substrates to each other can be carried out via molecular bonding, anodic bonding, or via eutectic bonding or via thermocompression using a sealing bead between the substrates. Such a sealing bead comprises for example one of the following eutectic systems: Al—Ge, Au—Si, Au—Sn, etc.

On the same substrate, a plurality of types of micro-devices, corresponding in particular to sensors, can be present: accelerometers, gyroscopes, magnetometers, etc. However, these sensors often need to be encapsulated under different pressures in order to operate correctly. For example, in the automobile field, accelerometers require an operating pressure of approximately 100 mbar, whereas gyroscopes require much lower operating pressures (approximately 1 μbar). Getter materials can be used to obtain these various operating pressures, as is described in the document US 2010/0025845 A1.

In other fields, it is possible for various elements of the same micro-device to require different operating pressures. Thus, certain inertial sensors comprise a plurality of suspension stages, mobile with respect to each other, and operating at different pressures. For example, to insulate a resonant system (for example comprising a mobile mass and a stationary frame) from outside vibrations, a simple mobile link between the mobile mass and the stationary frame is not sufficient. A double suspension stage must be used in this case. For this, the stationary frame is linked to an intermediate mobile element to which the mobile mass is connected. In such a resonant system, the mobile mass requires an optimal operating pressure P1, while the intermediate suspension stage formed by the intermediate mobile element requires an operating pressure P2 different from P1.

The document US 2008/0136000 A1 describes a MEMS device in which various elements of the micro-device are encapsulated in cavities at different pressures. However, the solution proposed in this document is not suitable for encapsulating a micro-device having a plurality of suspension stages because of the mobility of the various elements with respect to each other.

DISCLOSURE OF THE INVENTION

Thus there is a need to propose a micro-device, for example such as a MEMS and/or NEMS, having a plurality of suspension stages, allowing good insulation of the sensitive portion of the micro-device from the outside vibrations, and which allows different atmospheres to be obtained in the various cavities of the micro-device.

For this, one embodiment proposes a micro-device comprising at least:
a substrate;
a stationary element rigidly connected to the substrate;
a first mobile element suspended from the stationary element by first retention elements and configured to move with respect to the stationary element;
a second mobile element suspended from the first mobile element by second retention elements and configured to move with respect to the first mobile element and the stationary element;
a first cavity, at least some of the walls of which is formed by the stationary element and in which the first mobile element is encapsulated;
a second cavity positioned in the first cavity, at least some of the walls of which is formed by the first mobile element, in which the second mobile element is encapsulated and which is insulated from the first cavity.

Thus, a micro-device is proposed comprising a plurality of cavities embedded within each other and the walls of which are partly formed by the various stationary and mobile elements forming the various suspension stages of the micro-device. Thus, a structure is obtained that is well suited for carrying out the filtration of the outside vibrations and provides various atmospheres in the various cavities.

The micro-device may correspond in particular to a sensor that is for example inertial, such as an accelerometer, a gyroscope, a magnetometer, a pressure sensor, a microphone, etc.

The micro-device is compatible with all the types of detection or excitation mode of the second mobile element: capacitive, piezoelectric, piezoresistive, etc.

The second cavity may be sealed, for example hermetically, with respect to the first cavity. More generally, the first and/or the second cavity may be hermetically sealed or not according to the intended uses. For example, when the cavities only require insulation from the vibrations, it is not necessary to seal them hermetically. The first and second cavities are distinct from one another.

The stationary element may form a stationary frame rigidly connected to the substrate and the first mobile element may form a mobile frame suspended from the stationary frame.

The stationary frame and the mobile frame may each have a substantially polygonal shape or be in the shape of a substantially circular ring.

In one specific embodiment, the centres of the first and second cavities may be aligned one above the other along an axis substantially perpendicular to the substrate, and in particular substantially perpendicular to the main faces (faces having the greatest dimensions) of the substrate. In this case, the first and second cavities are concentric with respect to one another. Other configurations, however, are possible.

The micro-device may further comprise at least one first opening formed through at least one of the walls of the first cavity, such that the pressure in the first cavity is substantially equal to a pressure outside of the micro-device, and/or at least one second opening formed through at least one of the walls of the second cavity, such that the pressure in the second cavity is substantially equal to the pressure outside of the micro-device (whether or not the first cavity is hermetically sealed).

The micro-device may further comprise a first cover rigidly connected to the stationary element and sealing the first cavity and/or a second cover rigidly connected, for example hermetically, to the first mobile element and sealing, for example hermetically, the second cavity with respect to the first cavity, the second cover being mobile with respect to the first cover and the stationary element.

In this case, the micro-device may further comprise a first sealing bead rigidly connecting, for example hermetically, the first cover to the stationary element, and/or a second sealing bead rigidly connecting, for example hermetically, the second cover to the first mobile element, the second sealing bead being mobile with respect to the first sealing bead, the first cover and the stationary element.

The micro-device may further comprise:
  a third mobile element positioned between the first and second mobile elements, suspended from the first mobile element by third retention elements, configured to move with respect to the first mobile element and the stationary element, and which is encapsulated in the second cavity;
  a third cavity positioned in the second cavity, at least some of the walls of which is formed by the third mobile element, in which the second mobile element is encapsulated and which is sealed, for example hermetically, or insulated, with respect to the atmosphere of the first and second cavities;
  and wherein the second mobile element is suspended from the third mobile element by the second retention elements and configured to move with respect to the third mobile element, the first mobile element and the stationary element.

Thus, a triple suspension stage is formed that improves the insulation of the second mobile element from outside vibrations.

Another embodiment relates to a method for manufacturing a micro-device, comprising at least:
  making of a stationary element rigidly connected to a substrate;
  making of a first mobile element suspended from the stationary element by first retention elements and configured to move with respect to the stationary element;
  making of a second mobile element suspended from the first mobile element by second retention elements and configured to move with respect to the first mobile element and the stationary element;
  making of a first cavity, at least some of the walls of which is formed by the stationary element and in which the first mobile element is encapsulated;
  making of a second cavity positioned in the first cavity, at least some of the walls of which is formed by the first mobile element, in which the second mobile element is encapsulated and which is insulated from the first cavity.

The second cavity may be sealed, for example hermetically, with respect to the atmosphere of the first cavity.

In this case, the making of the stationary element, of the first mobile element and of the second mobile element may comprise the implementation of the following steps:
  etching of a first layer of material, for example of semiconductor, positioned on a first sacrificial layer, for example dielectric, itself positioned on the substrate, such that remaining portions of the first layer of material form the stationary element, the first mobile element, the second mobile element, the first retention elements and the second retention elements, then
  etching of a portion of the first sacrificial layer through the first etched layer of material, making the first mobile element and the second mobile element mobile with respect to the stationary element.

Moreover, the making of the first cavity and of the second cavity may comprise the implementation of a transfer of a second layer of material, for example of semiconductor, onto the stationary element and the first mobile element, such that:
  a first portion of the second layer of material is rigidly connected to the stationary element,
  a second portion of the second layer of material, mobile with respect to the first portion of the second layer of material and forming a second cover of the second cavity, is rigidly connected to the first mobile element,
  the first portion of the second layer of material is rigidly connected to a second substrate such the second layer of material is positioned between the stationary element and mobile elements and the second substrate that forms a first cover of the first cavity,
  the second portion of the second layer of material is mobile with respect to the second substrate.

The first layer of material and/or the second layer of material may be monolithic (that is to say, formed from a single layer of material), and may comprise a semiconductor, or may be multilayer (that is to say, formed by a stack of layers).

The sacrificial layer may advantageously be a dielectric layer.

Alternatively, the making of the first cavity and of the second cavity may comprise the implementation of the following steps:
  etching of a second layer of material, for example of semiconductor, positioned on a second sacrificial layer, for example dielectric, itself positioned on a second substrate, forming a first portion of the second layer of material, a second portion of the second layer of material and fourth retention elements such that the second portion of the second layer of material is configured to be suspended from the first portion of the second layer of material by the fourth retention elements;
  transfer of the second layer of material onto the stationary element and the first mobile element, such that the first portion of the second layer of material is rigidly connected to the stationary element and the second portion of the second layer of material is rigidly connected to the first mobile element,
  etching of a portion of the second sacrificial layer through openings passing through the second substrate, making the second portion of the second layer of material mobile with respect to the first portion of the second layer of material and the second substrate.

The transfer of the second layer of material onto the stationary element and the first mobile element may comprise the implementation of direct bonding between the second layer of material and the stationary element and between the second layer of material and the first mobile element, or sealing between the second layer of material and the stationary element by a first sealing bead and sealing between the second layer of material and the first mobile element by a second sealing bead. The sealing beads may correspond to sealing beads comprising one or more polymer materials, or sealing beads comprising one or more metal materials, for example eutectic systems.

BRIEF DESCRIPTION OF THE DRAWINGS

The present invention will be better understood upon reading the description of examples of embodiments that are given purely for informational purposes and in a way that is not at all limiting in reference to the appended drawings in which.

Identical, similar or equivalent portions of the various drawings described below have the same numerical references in order to facilitate the passage from one drawing to another.

The various portions shown in the figures are not necessarily on the same scale in order to make the drawings more readable.

The various possibilities (alternatives and embodiments) must be understood as not being exclusive of each other and can be combined together.

DETAILED DISCLOSURE OF SPECIFIC EMBODIMENTS

A micro-device 100 according to a first embodiment is described below in relation to the FIGS. 1A and 1B that schematically show the micro-device 100.

The micro-device 100 comprises a stationary element 102 corresponding, in this first embodiment, to a stationary frame surrounding various mobile portions of the micro-device 100.

The micro-device 100 also comprises a first mobile element 104 corresponding, in this first embodiment, to a mobile frame. The first mobile element 104 is positioned inside the space surrounded by the frame formed by the stationary element 102. Moreover, the first mobile element 104 is suspended from the stationary element 102 by first retention means 106 corresponding for example to first arms for retaining in suspension that can correspond to micro-beams.

These first retention means 106 are such that the first mobile element 104 can move with one or more degrees of freedom with respect to the stationary element 102. Thus, in the example of FIG. 1A, the mobile frame formed by the first mobile element 104 can move in translation with respect to the stationary frame formed by the stationary element 102, in parallel to the axis X and in parallel to the axis Y. Alternatively, other types of movement of the first mobile element 104 with respect to the stationary element 102 are possible: translation in parallel to the axis Z, and/or rotation along at least one of the axes X, Y and Z.

The micro-device 100 also comprises a second mobile element 108 corresponding, in this first embodiment, to a mobile mass. The second mobile element 108 is positioned in the space surrounded by the mobile frame formed by the first mobile element 104. The second mobile element 108 is suspended from the first mobile element 104 by second retention means 110 corresponding for example to second arms for retention in suspension that can correspond to micro-beams.

These second retention means 110 are such that the second mobile element 108 can move with one or more degrees of freedom with respect to the first mobile element 104, and thus also with respect to the stationary element 102. Thus, in the example of FIG. 1A, the mobile mass formed by the second mobile element 108 can move in translation, with respect to the first mobile element 104, in parallel to the axis X and in parallel to the axis Y. Alternatively, other types of movement of the second mobile element 108 with respect to the first mobile element 104 are possible: translation in parallel to the axis Z, and/or rotation along at least one of the axes X, Y and Z.

When the first and second retention means 106, 110 are formed by micro-beams, these micro-beams can be made in the form of springs. Here, these micro-beams have micrometric and/or nanometric dimensions (for example between several nanometres and several tens of micrometres).

In this first embodiment, the micro-device 100 corresponds to an inertial sensor configured to detect the movements of the mobile mass, which is formed by the second mobile element 108, in the plane (X, Y) with respect to the stationary element 102. In order to detect this movement, first interdigitated combs 112 are present at the inner faces of the frame formed by the stationary element 102 and at the outer faces of the frame formed by the first mobile element 104. These first interdigitated combs 112 detect the movement of the first mobile element 104 in translation in the plane (X, Y) with respect to the stationary element 102. Second interdigitated combs 114 are also present at the inner faces of the frame formed by the first mobile element 104 and at the outer faces of the second mobile element 108. These second interdigitated combs 114 detect the movement of the second mobile element 108 in translation in the plane (X, Y) with respect to the first mobile element 104.

In the first embodiment described here, the interdigitated combs 112, 114 carry out capacitive detection of the movement of the mobile elements 104 and 108. Alternatively, it is possible for the micro-device 100 to comprise other means for detecting the movements of the first mobile element 104 and/or of the second mobile element 108, instead of or in addition to the interdigitated combs 112, 114. These detection means are for example capacitive and/or piezoelectric and/or piezoresistive, etc.

Moreover, it is also possible for the micro-device 100 to comprise means for exciting the first mobile element 104 and/or the second mobile element 108, configured to move the first mobile element 104 and/or the second mobile element 108. Like for the detection means, the excitation means correspond for example to capacitive, piezoelectric, piezoresistive, etc. elements.

Figure 1A:
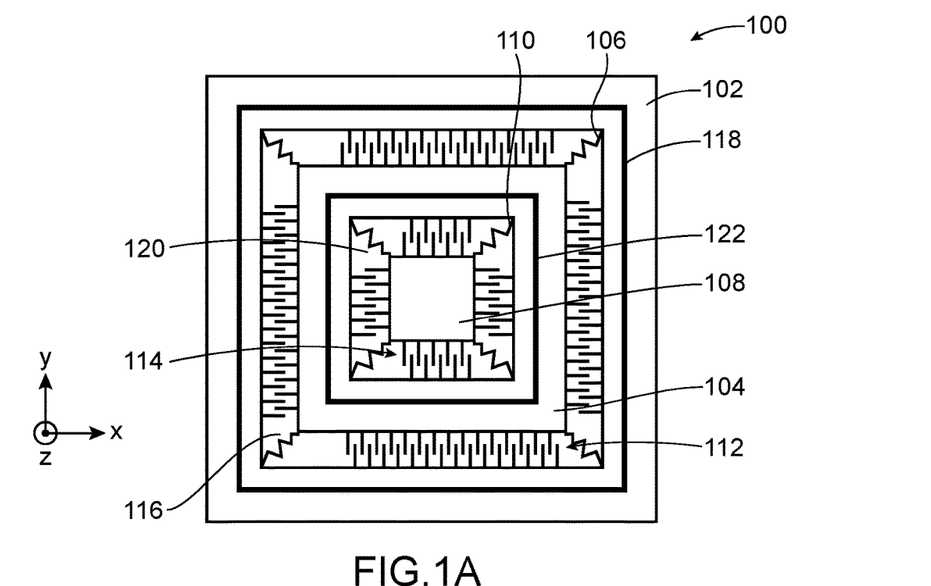
FIGS. 1A and 1B show a micro-device according to a first embodiment.
Figure 1B:
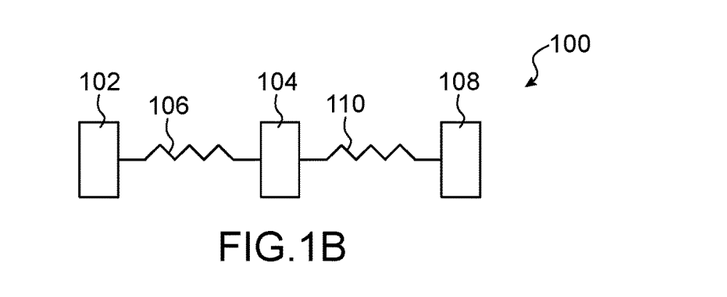

In the first embodiment described in relation to FIGS. 1A and 1B, the second mobile element 108, the movement of which is intended to be detected, is connected to the stationary element 102 via two successive suspension means 106, 110 independent of one another. Thus, if the micro-device 100 is subjected to outside vibrations, these vibrations move the stationary element 102 but not the mobile elements 104 and 108. No movement is thus detected by the second interdigitated combs 114. The micro-device 100 can thus emit an output signal representative of the movement of the second mobile element 108 independently of the movement of the stationary element 102.

Although not visible in FIGS. 1A and 1B, the elements of the micro-device 100 are made on a substrate to which the stationary element 102 is rigidly connected.

The first mobile element 104 is encapsulated in a first cavity 116 that can be sealed hermetically with respect to the environment outside of the micro-device 100 and delimited by the substrate, the inner faces of the stationary element 102 (which form at least some of the lateral walls of this first cavity 116) and a first cover (not visible in FIGS. 1A and 1B) rigidly connected to the stationary element 102 via a first sealing bead 118. Moreover, the second mobile element 108 is encapsulated in a second cavity 120 that is sealed here hermetically with respect to the atmosphere in the first cavity 116, or more generally insulated from the first cavity 116, and defined by the substrate, the inner faces of the first mobile 104 (which form at least some of the lateral walls of this second cavity 120) and a second cover (not visible in FIGS. 1A and 1B) rigidly connected to the first mobile element 104 via a second sealing bead 122. The second sealing bead 122 and the second cover are, like the first mobile element 104, mobile with respect to the stationary element 102. Moreover, the first sealing bead 118 and the first cover are stationary with respect to the substrate on which the micro-device 100 is made.

Because the inner volumes of each of the cavities 116, 120 are not connected to each other, the first mobile element 104 can be encapsulated in a different atmosphere than that in which the second mobile element 108 is encapsulated, that is to say, in the presence of different gas and/or a different pressure. For example, it is possible for the pressure in the first cavity 116 to correspond to atmospheric pressure (in this case, with a first cavity 116 that is not hermetically sealed with respect to the outside environment) and the inside of the second cavity 120 to be at a pressure P1 different than atmospheric pressure.

Moreover, the sealing of the various cavities of the micro-device 100 can be carried out by implementing a single sealing step of the first and second covers on the scale of the substrate.

Figure 2A:
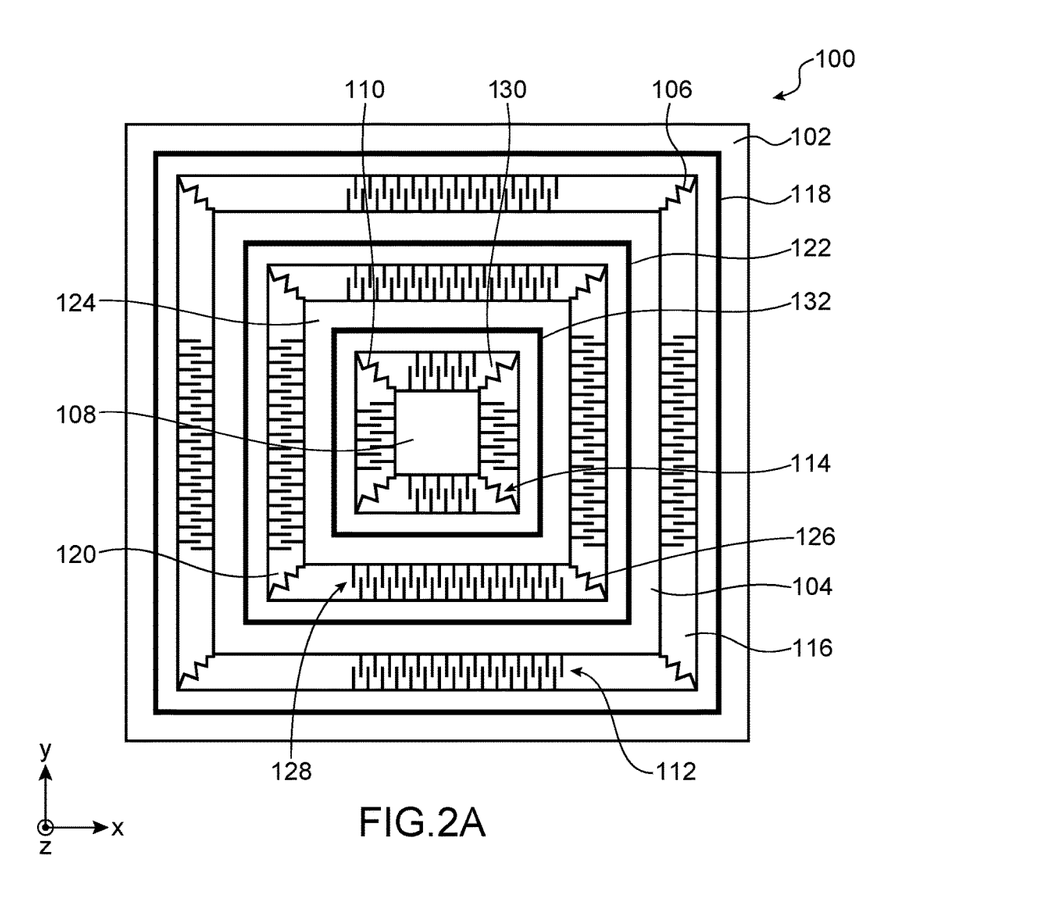
FIGS. 2A and 2B show a micro-device according to a second embodiment.
Figure 2B:
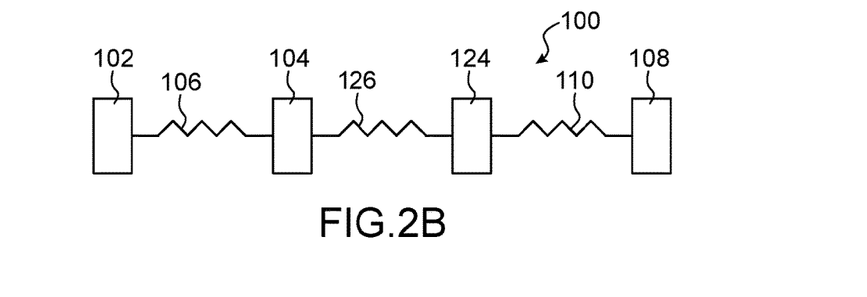

Another micro-device 100 according to a second embodiment is schematically shown in FIGS. 2A and 2B.

Like in the first embodiment described above, the micro-device 100 shown in FIGS. 2A and 2B comprises the stationary element 102, from which the first mobile element 104 is suspended by the first retention means 106. This micro-device 100 also comprises the second mobile element 108 forming the mobile mass of the micro-device 100, the movements of which are intended to be detected.

However, contrary to the first embodiment in which the second mobile element 108 is suspended from the first mobile element 104 via the second retention mean 110, the micro-device 100 comprises a third mobile element 124 interposed between the first and second mobile elements 104, 108. In this second embodiment, the second mobile element 108 is positioned in the space surrounded by the frame formed by the third mobile element 124, and is suspended from the third mobile element 124 by the second retention means 110. The second mobile element 108 can thus move with one or more degrees of freedom with respect to the third mobile element 124.

The third mobile element 124 is positioned in the space surrounded by the frame formed by the first mobile element 104. Moreover, the third mobile element 124 is suspended from the first mobile element 104 by third retention means 126 corresponding for example to micro-beams. These third retention means 126 are such that the third mobile element 124 can move with one or more degrees of freedom with respect to the first mobile element 104, and thus also with respect to the stationary element 102. In the example of FIG. 2A, the third mobile element 124 can move in translation in parallel to the axis X and in parallel to the axis Y. Alternatively, other types of movement of the third mobile element 124 with respect to the first mobile element 104 are possible: translation in parallel to the axis X, rotation along at least one of the axes X, Y and Z, etc.

In order to ensure the continuity of the detection of the movement of the second mobile element 108 from the centre of the micro-device 100 to the stationary element 102, the micro-device 100 comprises, in addition to the first interdigitated combs 112 present at the inner faces of the frame formed by the stationary element 102 and at the outer faces of the frame formed by the first mobile element 104 and the second interdigitated combs 114 present at the inner faces of the frame formed by the third mobile element 124 and at the outer faces of the second mobile element 108, third interdigitated combs 128 present at the inner faces of the frame formed by the first mobile element 104 and at the outer faces of the frame formed by the third mobile element 124. These third interdigitated combs 114 ensure the detection of the translation movement of the third mobile element 124 in the plane (X, Y) with respect to the first mobile element 104.

Alternatively, it is possible for the micro-device 100 to comprise other means for detecting the movements of the first mobile element 104 and/or of the second mobile element 108 and/or of the third mobile element 124, instead of or in addition to the interdigitated combs 112, 114 and 128. These detection means are for example capacitive and/or piezoelectric and/or piezoresistive, etc.

In this second embodiment described in relation to FIGS. 2A and 2B, the second mobile element 108, the movement of which is intended to be detected, is connected to the stationary element 102 via three successive suspension means 106, 126, 110 independent of one another. With respect to the first embodiment, this configuration further improves the insulation of the second mobile element 108 from vibrations, or more generally from outside mechanical disturbances that the micro-device 100 undergoes.

Like in the first embodiment, the first mobile element 104 is encapsulated in the first cavity 116 that can be sealed hermetically with respect to the environment outside of the micro-device 100 and defined by the substrate, the inner faces of the stationary element 102 (which form at least some of the lateral walls of this first cavity 116) and the first cover (not visible in FIGS. 2A and 2B) rigidly connected to the stationary element 102 via the first sealing bead 118. The third mobile element 124 is encapsulated in the second cavity 120 that is sealed here hermetically with respect to the atmosphere in the first cavity 116, or more generally insulated from the first cavity 116, and defined by the substrate, the inner faces of the first mobile 104 (which form at least some of the lateral walls of this second cavity 120) and the second cover (not visible in FIGS. 2A and 2B) rigidly connected to the first mobile element 104 via the second sealing bead 122. The second sealing bead 122 and the second cover are, like the first mobile element 104, mobile with respect to the stationary element 102. Finally, the second mobile element 108 is encapsulated in a third cavity 130 that is for example sealed hermetically, or more generally insulated, with respect to the atmospheres in the first and second cavities 116 and 120, and defined by the substrate, the inner faces of the third mobile element 124 (which form at least some of the lateral walls of this third cavity 130) and a third cover (not visible in FIGS. 2A and 2B) rigidly connected to the third mobile element 124 via a third sealing bead 132. The third sealing bead 132 and the third cover are, like the third mobile element 124, mobile with respect to the first mobile element 104 and with respect to the stationary element 102.

Because each of the cavities 116, 120 and 130 is insulated from each other, the first mobile element 104 can be encapsulated in a different atmosphere than that in which the second mobile element 108 is encapsulated and that in which the third mobile element 124 is encapsulated, that is to say, in the presence of different gas and/or pressure.

According to other embodiments, it is possible for the micro-device 100 to comprise more than two intermediate mobile elements interposed, via distinct suspension means, between the stationary element and the mobile element forming the mobile mass of the micro-device 100.

Figure 3:
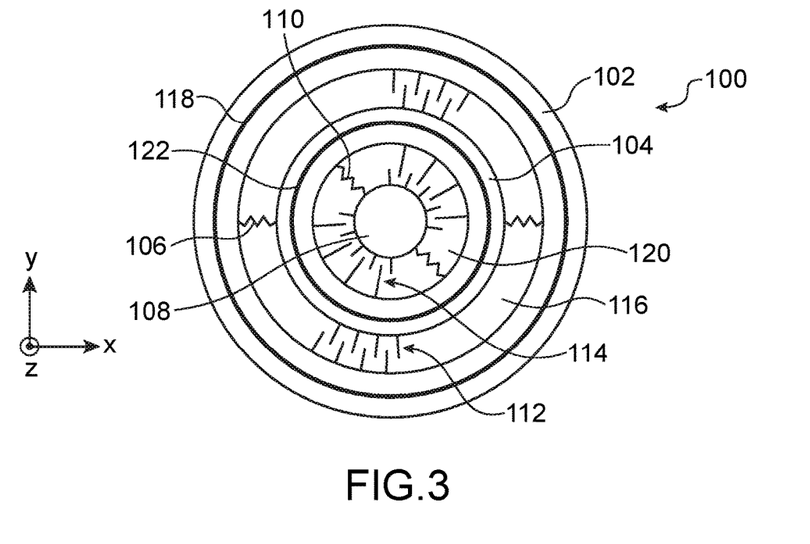
FIGS. 3 to 7 show micro-devices according to various alternative embodiments.
Figure 4:
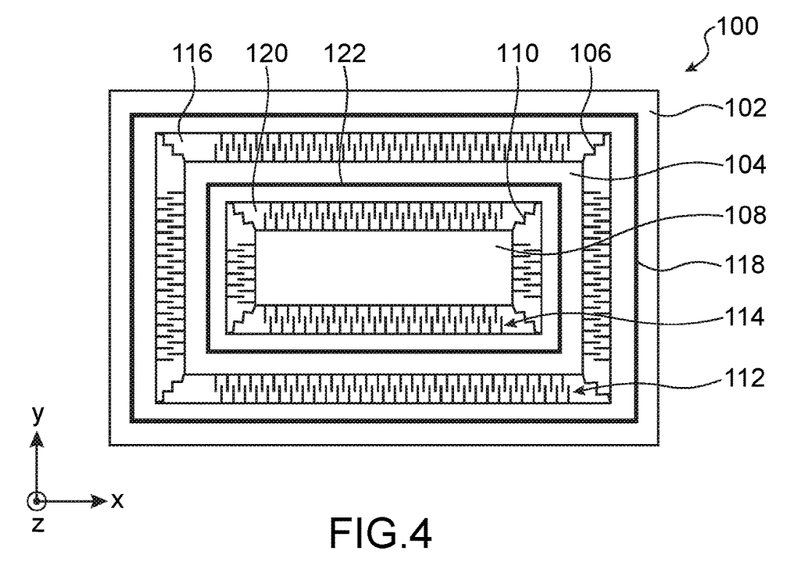
Figure 5:
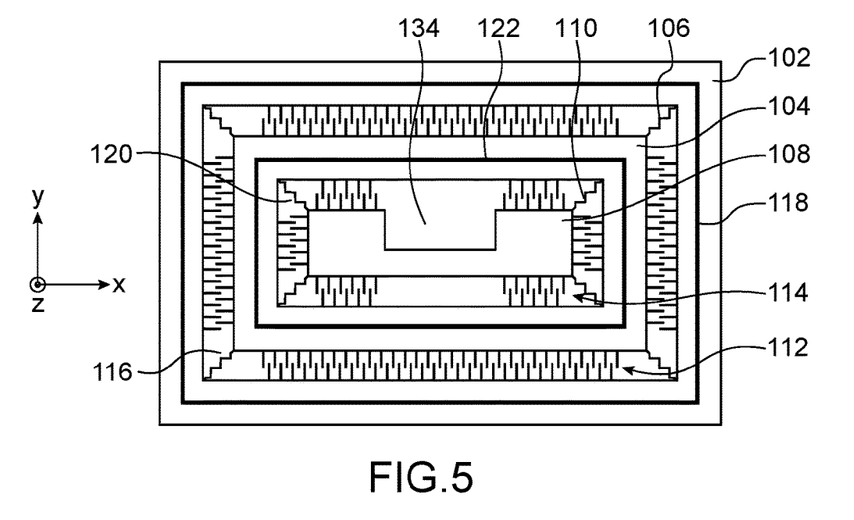

In the two embodiments described above, the elements 102, 104 and 124 have cross-sections, in the plane of the substrate on which the micro-device 100 is made, forming substantially square frames. Alternatively, other shapes are possible. For example, the micro-device 100 shown in FIG. 3 comprises elements 102 and 104 having an annular shape in the plane (X, Y) substantially parallel to the substrate. The second mobile element 108 has the shape of a disc in the plane (X, Y). Here, the cavities 116 and 120 thus have cylindrical shapes. According to another example, the micro-device 100 shown in FIG. 4 comprises elements 102 and 104 forming rectangular frames in the plane (X, Y). The second mobile element 108 also has a rectangular shape in the plane (X, Y). FIG. 5 shows another micro-device 100 in which, contrary to the previous examples in which the second mobile element 108 has a shape substantially corresponding to that of the cavity in which it is encapsulated, the second element 108 has here a shape different than that of the cavity 120 in which it is encapsulated. In this example of a specific embodiment shown in FIG. 5, the second mobile element 108 has a shape, in the plane (X, Y), having a hollow 134. In this example of a specific embodiment, the structure is symmetrical with respect to an axis parallel to the axis Y (contrary to the structures of the previous embodiments that are symmetrical with respect to their centre).

Figure 6:
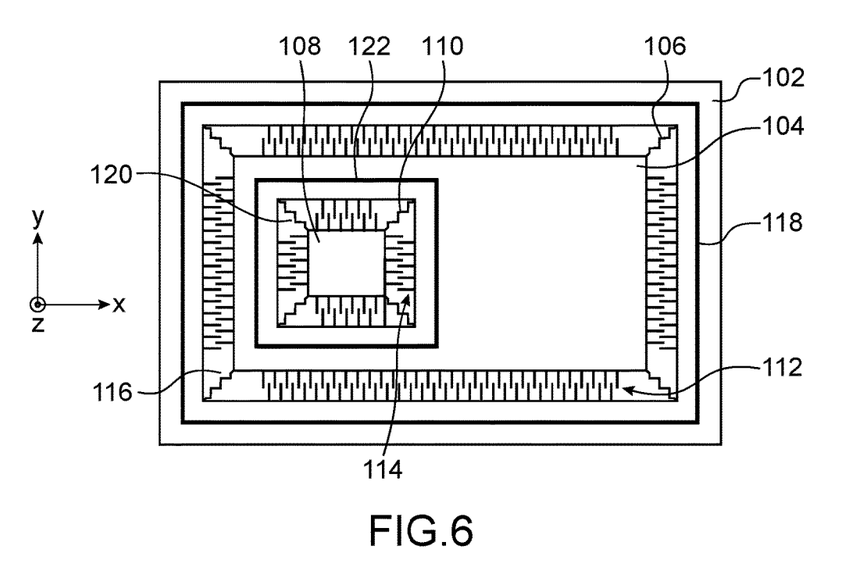
Figure 7:
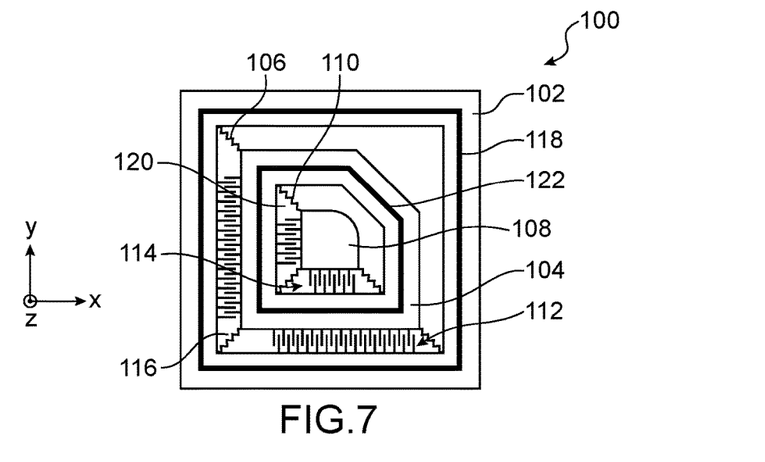

In the examples of embodiments described above in relation to FIGS. 1A to 5, the various cavities embedded within one another in the micro-device 100 are concentric, that is to say, the centres thereof are positioned one above the other. Alternatively, it is possible for the centres of these cavities to be offset with respect to each other. For example, in the micro-device 100 shown in FIG. 6, the second cavity 120 is not centred with respect to the first cavity 116 because one of the sides of the first mobile element 104 is much larger than the other sides. According to another example of an embodiment shown in FIG. 7, the cavities 116 and 120 are not concentric because the cavity 116 does not have the same shape as the cavity 120 in the plane (X, Y).

In the various embodiments and examples described above, the various cavities of the same micro-device 100 can be sealed simultaneously during a single sealing step carried out collectively on the scale of the substrate.

Moreover, although the various cavities of the same micro-device 100 can be sealed simultaneously by implementing the same step of collective sealing on the scale of the substrate, the materials used to form the various sealing beads of the various cavities of the same micro-device 100 can be different from one sealing bead to the other.

In order to make the sealing beads, it is possible to make a first portion of the bead on the face of the element onto which a cover is intended to be rigidly connected, and a second portion of the bead on the face of the cover intended to be rigidly connected to one of the elements of the micro-device. For example, it is possible to deposit a first sealing material onto the cover and deposit a second sealing material onto the stationary or mobile element of the micro-device 100, wherein these first and second sealing materials can be similar or not. The materials of the sealing bead are advantageously metal materials such as eutectic alloys. For example, a sealing bead can be made from portions of Au—Si rigidly connected to each other in order to form the sealing bead. It is also possible for one of the portions of the bead to comprise Au—Si and the other of the portions of the bead to comprise Au—Sn.

In the embodiments and examples described above, the covers are rigidly connected to the various stationary and mobile elements of the micro-device 100 via sealing beads 118, 122 and 132. These beads of sealings can comprise metal materials when the covers are rigidly connected to the stationary and mobile elements of the micro-device 100. It is also possible for these sealing beads to comprise one or more non-metal materials, for example one or more polymer materials. Alternatively, it is possible for the covers to be rigidly connected to the various stationary and mobile elements of the micro-device 100 via the implementation of direct bonding. In this case, no sealing bead is arranged between the covers and the stationary and mobile elements of the micro-device 100.

A method for manufacturing a micro-device 100 according to a specific embodiment will now be described in relation to FIGS. 8A to 8F. The micro-device 100 obtained by the implementation of this method corresponds to the micro-device 100 previously described in relation to FIGS. 1A and 1B.

The micro-device 100 is for example made from a first semiconductor-on-insulator substrate, for example SOI (silicon on insulator). This substrate, visible in FIG. 8A, comprises a supporting layer 136, a buried dielectric layer 138, or BOX ("Buried Oxide"), comprising for example a semiconductor oxide such as $SiO_2$, and a surface layer of semiconductor 140 comprising for example silicon. The total thickness of the layers 138 and 140 is for example between approximately 100 nm and 100 µm. Trenches 165 are made through the supporting layer 136.

Figure 8A:
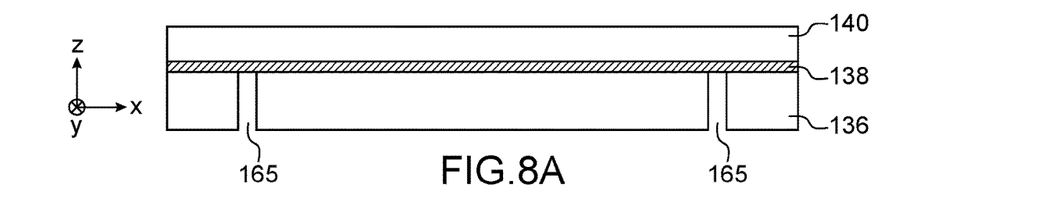
FIGS. 8A to 8F show steps of a method for manufacturing a micro-device according to a specific embodiment.

In general, the layer 140 comprises a layer of material configured to make the various stationary and mobile elements of the micro-device 100. The layer 138 corresponds to a layer of sacrificial material.

Alternatively, the micro-device 100 can be made from a bulk substrate 136 comprising for example a semiconductor such as silicon, onto which a sacrificial layer 138, for example dielectric such as a layer of semiconductor oxide, and a layer of material 140 in which the mobile structures of the micro-device 100 will be made, corresponding for example to a layer of semiconductor such as doped or non-doped silicon, doped or non-doped germanium, etc., are successively deposited. The sacrificial layer 138 and the layer of material 140 can be formed by implementing various techniques such as deposition, such as LPCVD (low pressure chemical vapour deposition), PECVD (plasmaenhanced chemical vapour deposition), ALD (atomic layer deposition), PVD (physical vapour deposition), or via epitaxy, etc.

Figure 8B:
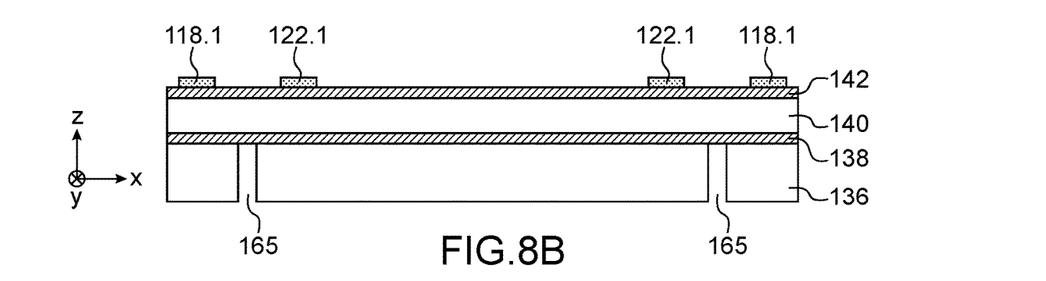

A dielectric layer 142 is then made on the sacrificial layer 140. A layer of a first material of the sealing bead is then deposited on the dielectric layer 142. This first material is for example a metal material, such as Au, Al or SnAg, or a semiconductor material such as Ge. This layer of the first material of the sealing bead is etched in order to form first portions of the various sealing beads that the micro-device 100 is intended to comprise. In the example of FIG. 8B, the layer is etched and the remaining portions of this layer preserved on the dielectric layer 142 correspond to a first portion 118.1 of the first sealing bead 118 and to a first portion 122.1 of the second sealing bead 122.

Figure 8C:
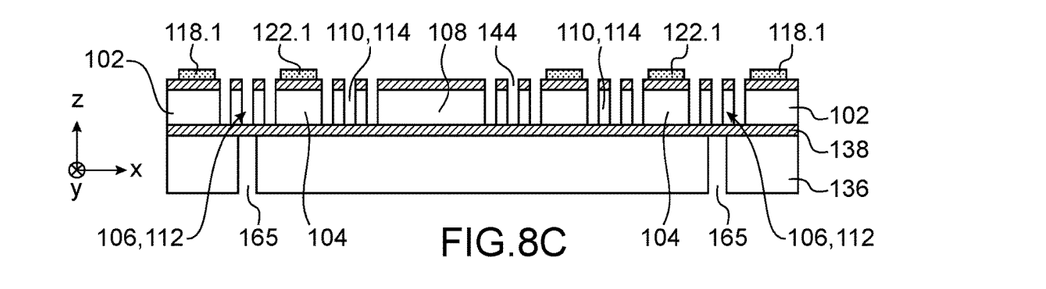

As shown in FIG. 8C, etching is then carried out through the layers 142 and 140 in order to form, in the layer of semiconductor 140, the various stationary and mobile elements of the micro-device 100 (the element 102 and the mobile elements 104 and 108 in the example of FIG. 8C) and the retention means by which the mobile elements are intended to be suspended (micro-beams 106 and 110 in the example of FIG. 8C), and also the detection and/or actuation elements of the micro-device 100 (first and second interdigitated combs 112 and 114 in the example of FIG. 8C). The trenches etched through the layers 142 and 140 that define the various elements of the micro-device 100 also form the spaces that will then be used to release the various elements of the micro-device 100. If necessary, the etching implemented at this step of the method can also be used to make additional release holes 144 through the layers 142 and 140 if the trenches defining the various elements of the micro-device 100 are not sufficient for the later releasing of these elements. In the example of FIG. 8C, release holes 144 are formed through the second mobile element 108 in order for the material of the layer 138 located under the second mobile element 108 to be able to be correctly etched.

Figure 8D:
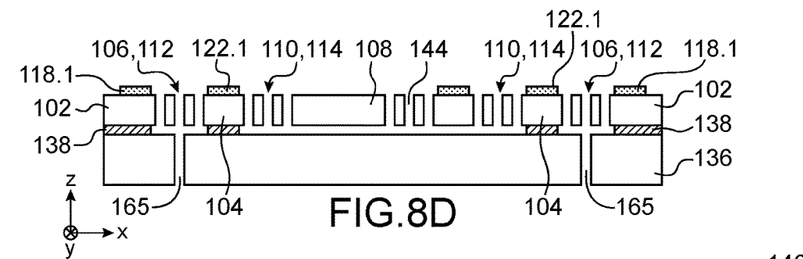

Etching of a portion of the layer 138 is then carried out through the trenches and the optional release holes 144 made during the previous etching step, in order to release the mobile elements 108 and 104 of the micro-device 100 (see FIG. 8D). Portions of the layer 138 are preserved under the mobile element 104. The mobility of the mobile element 104 with respect to the stationary portion 102 is ensured by the trenches 165.

Figure 8E:
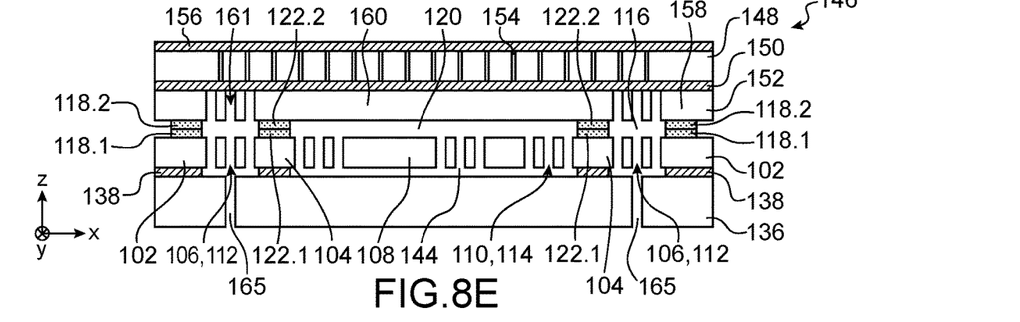

A second substrate 146 is then transferred onto the structure previously made in order to form the covers of the cavities in which the mobile elements 104 and 108 of the micro-device 100 are encapsulated. In the example shown in FIG. 8E, this second substrate 146 corresponds to a semiconductor-on-insulator substrate such as an SOI substrate comprising a supporting layer 148, a buried dielectric layer 150 and a surface layer of semiconductor 152 comprising for example silicon. Here, the second substrate 146 is rigidly connected to the various stationary and mobile elements of the micro-device 100 via the implementation of metal sealing. In the example of FIG. 8E, second portions 118.2 and 122.2 of the sealing beads 118, 122 are previously formed on the surface layer 152, then these second portions 118.2 and 122.2 of the sealing beads 118, 122 are placed in contact against the first portions 118.1 and 122.1 of the sealing beads 118, 122, and annealing completes the formation of the sealing beads 118 and 122. The sealing beads 118, 122 are for example formed by first portions 118.1 and 122.1 comprising Au and second portions 118.2 and 122.2 comprising Si or Au or Sn, or by first portions 118.1 and 122.1 comprising Al and second portions 118.2 and 122.2 comprising Ge.

Alternatively, the second substrate 146 could be rigidly connected to the assembly previously made via the implementation of direct sealing, or direct bonding, for example silicon against silicon, or dielectric against dielectric, or dielectric against silicon, etc. According to another alternative, beads of one or more non-metal materials, for example polymers, could be formed between the second substrate 146 and the structure previously made comprising the various elements of the micro-device 100.

In the example of an embodiment shown in FIG. 8E, release holes 154 pass through the supporting layer 148 and form accesses to the buried dielectric layer 150. These release holes 154 are temporarily plugged via a dielectric layer 156 covering the face of the supporting layer 148 opposite to that against which the buried dielectric layer 150 is located.

Before the transfer of the second substrate 146, the surface layer 152 is structured in order to form various portions intended to be part of the various covers of the cavities in which the various mobile portions of the micro-device 100 are encapsulated. Thus, in the example of FIG. 8E, a first portion 158 of the surface layer 152, which is stationary with respect to the stationary element 102, forms, together with the supporting layer 148, the first cover of the first cavity 116. A second portion 160 of the surface layer 152 is mobile with respect to the first portion 158 via means 161, for example arms such as micro-beams, for retaining this second portion 160 in suspension with respect to the first portion 158. This second portion 160 of the surface layer 152 forms the second cover of the second cavity 120.

According to an example of a specific embodiment, it is possible for at least one opening 155 (shown by dotted lines in FIG. 8F) to be made through the supporting layer 136 in order to connect the inside of the second cavity 120 with the outside atmosphere in which the micro-device 100 is located. In this case, the pressure in the second cavity 120 corresponds to the pressure outside of the micro-device 100.

Figure 8F:
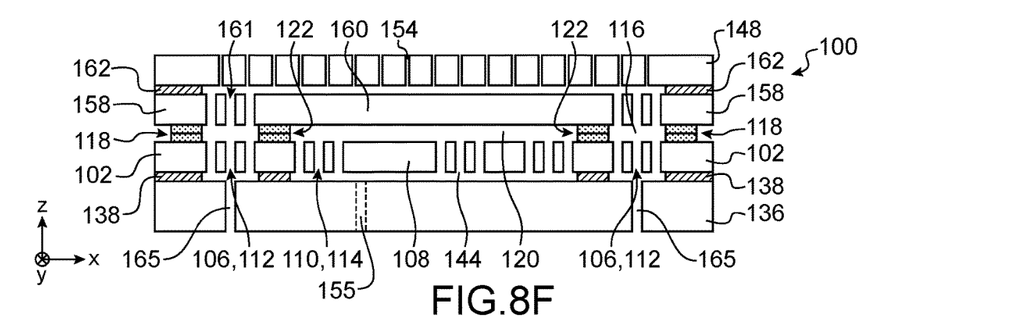

The micro-device 100 is completed by etching the dielectric layer 156 and the portions of the buried dielectric later 150 accessible via the release holes 154, thus releasing the second portion 160 of the surface layer 152 from the supporting layer 148 and thus making the second cover mobile with respect to the first cover (FIG. 8F). Because of the non-plugged release holes 154, the pressure in the first cavity 116 corresponds to the pressure outside the micro-device 100.

Thus, the micro-device 100 obtained and shown in FIG. 8F comprises:

- a first stationary element 102 rigidly connected to the substrate 136 via the remaining portions of the buried dielectric layer 138;
- a first mobile element 104 suspended from the stationary element 102 by the retention means 106, here arms formed by micro-beams;
- a first cavity 116 in which the first mobile element 104 is encapsulated and the lateral walls of which are formed by remaining portions of the layer 138, the stationary element 102, the first sealing bead 118, the first portion 158 of the surface layer 152 and remaining portions 162 of the buried dielectric layer 150, as well as by the first cover formed by the supporting layer 148 (and here through which the release holes 154 pass);

a second mobile element 108 suspended from the first mobile element 104 by the retention means 110, 114, here arms formed by micro-beams;

a second cavity 120 in which the second mobile element 108 is encapsulated and the lateral walls of which are formed by remaining portions of the layer 138, the first mobile element 104 and the second sealing bead 122, as well as by the second cover formed by the second portion 160 of the surface layer 152.

A method for manufacturing the micro-device 100 according to an alternative of the above embodiment will now be described.

The steps described above in relation to FIGS. 8A to 8D are first carried out.

Then, before transferring the second substrate 146 onto the structure obtained, the buried dielectric layer 150 is removed selectively with respect to the supporting layer 148 and the surface layer of semiconductor 152 in order to ensure the mobility of the second portion 160 of the surface layer 152, which is intended to form the second cover of the second cavity 120, with respect to the first portion 158 of this layer 152 intended to form a portion of the lateral walls of the first cavity 116.

Optionally, a portion or layer of getter material 164 can be positioned against the second portion 160 of the surface layer 152 in order for the portion of getter material 164 to be encapsulated in the second cavity 120, after the transfer of the second substrate 146. In this case, the temperature at which the sealing of the second substrate 146 is carried out, as well as the nature of the getter material used for the portion 164, can be advantageously chosen in such a way that the getter material of the portion 164 is thermally active during this sealing, that is to say, in such a way that the temperature of thermal activation of the getter material is less than or equal to that of the temperature at which the sealing is carried out.

Figure 9:
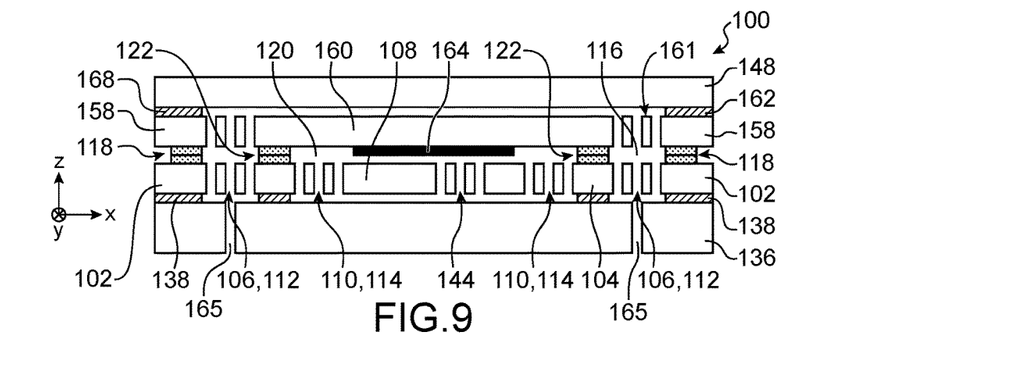
FIG. 9 shows a micro-device obtained by implementing a manufacturing method according to an alternative of the embodiment described in relation to FIGS. 8A to 8F.

The second substrate 146 is then transferred onto and sealed to the structure previously made, completing the making of the micro-device 100. The micro-device 100 obtained is shown in FIG. 9.

In this alternative embodiment, the difference in pressure between the first and second cavities 116, 120 is caused not by the fact that the pressure in the first cavity 116 is equal to atmospheric pressure obtained via holes passing through the layer 148, but because of the gaseous absorption and/or adsorption carried out by the portion of getter material 164 in the second cavity 120.

The invention claimed is:

1. A micro-device comprising at least:
   a substrate,
   a stationary element rigidly connected to the substrate,
   a first mobile element suspended from the stationary element by first retention elements and configured to move with respect to the stationary element,
   a second mobile element suspended from the first mobile element by at least second retention elements and configured to move with respect to the first mobile element and the stationary element,
   a first cavity, formed by at least one wall of the stationary element, completely surrounding the first mobile element,
   a second cavity, formed by at least one wall of the first mobile element, completely surrounding the second mobile element, wherein the second cavity is insulated from the first cavity, and the first cavity surrounds the second cavity.

2. The micro-device according to claim 1, wherein the stationary element forms a stationary frame rigidly connected to the substrate and wherein the first mobile element forms a mobile frame suspended from the stationary frame.

3. The micro-device according to claim 1, wherein at least one of the following conditions is fulfilled:
   the first mobile element is configured to move in translation, or in rotation, or in translation and rotation, with respect to the stationary element;
   the second mobile element is configured to move in translation, or in rotation, or in translation and rotation, with respect to the first mobile element and the stationary element.

4. The micro-device according to claim 1, wherein at least one of the following conditions is fulfilled:
   the first retention elements comprise first arms for retaining in suspension, the ends of which are connected to the stationary element and to the first mobile element;
   the second retention elements comprise second arms for retaining in suspension, the ends of which are connected to the first mobile element and to the second mobile element.

5. The micro-device according to claim 1, wherein centres of the first and second cavities are aligned one above another along an axis substantially perpendicular to the substrate.

6. The micro-device according to claim 1, further comprising at least one of:
   at least one first opening formed through the at least one wall of the stationary element, such that a pressure in the first cavity is substantially equal to a pressure outside of the micro-device;
   at least one second opening formed through the at least one wall of the stationary element, such that a pressure in the second cavity is substantially equal to the pressure outside of the micro-device.

7. The micro-device according to claim 1, further comprising at least one of:
   a first cover rigidly connected to the stationary element and sealing the first cavity; and
   a second cover rigidly connected to the first mobile element and sealing the second cavity with respect to the first cavity, the second cover being mobile with respect to the first cover and the stationary element.

8. The micro-device according to claim 7, further comprising at least one of:
   a first sealing bead rigidly connecting the first cover to the stationary element; and
   a second sealing bead rigidly connecting the second cover to the first mobile element, the second sealing bead being mobile with respect to the first sealing bead, the first cover and the stationary element.

9. The micro-device according to claim 1, further comprising at least one of:
   elements for at least one of detection and measurement of a movement of the first mobile element with respect to the stationary element;
   elements for at least one of detection and measurement of a movement of the second mobile element with respect to the first mobile element;
   elements configured to move the first mobile element with respect to the stationary element; and
   elements configured to move the second mobile element with respect to the first mobile element.

10. The micro-device according to claim 1, further comprising:
    a third mobile element suspended from the first mobile element by third retention elements, wherein the third mobile element surrounds the second mobile element and is configured to move with respect to the first and second mobile elements and the stationary element; and a third cavity, formed by at least one wall of the third mobile element, completely surrounding the second mobile element, wherein the second mobile element is suspended from the third mobile element by the second retention elements, and wherein the second mobile element is suspended from the first mobile element by the second retention element, the third mobile element and the third retention element.

11. The micro-device according to claim 10, wherein the third cavity is sealed with respect to an atmosphere of the first and second cavities.

12. The micro-device according to claim 10, wherein the first, second, and third cavities are concentrically centered.

13. The micro-device according to claim 10, wherein the first, second, and third cavities are hermetically sealed from one another.

14. The micro-device according to claim 1, wherein the first and second cavities are concentrically centered.

15. The micro-device according to claim 1, wherein the first and second cavities are hermetically sealed from each other.

16. A method for manufacturing a micro-device, comprising at least:

making a stationary element rigidly connected to a substrate;

making a first mobile element suspended from the stationary element by first retention elements and configured to move with respect to the stationary element, making a second mobile element suspended from the first mobile element by at least second retention elements and configured to move with respect to the first mobile element and the stationary element, making a first cavity, formed by at least one wall of the stationary element, completely surrounding the first mobile element, making a second cavity, formed by at least one wall of the first mobile element, surrounding the second mobile element, wherein the second cavity is insulated from the first cavity, and the first cavity surrounds the second cavity.

17. The method according to claim 16, wherein making the stationary element, the first mobile element and the second mobile element comprises steps of:

etching a first layer of material positioned on a first sacrificial layer itself positioned on the substrate, such that remaining portions of the first layer of material form the stationary element, the first mobile element, the second mobile element, the first retention elements and the second retention elements, then etching a portion of the first sacrificial layer through the etched first layer of material, making the first mobile element and the second mobile element mobile with respect to the stationary element.

18. The method according to claim 16, wherein making the first cavity and of the second cavity comprises transferring a second layer of material onto the stationary element and the first mobile element, such that:

a first portion of the second layer of material is rigidly connected to the stationary element, a second portion of the second layer of material, mobile with respect to the first portion of the second layer of material and forming a second cover of the second cavity, is rigidly connected to the first mobile element, the first portion of the second layer of material is rigidly connected to a second substrate such the second layer of material is positioned between the stationary element and mobile elements and the second substrate that forms a first cover of the first cavity, and the second portion of the second layer of material is mobile with respect to the second substrate.

19. The method according to claim 18, wherein transferring the second layer of material onto the stationary element and the first mobile element comprises:

direct bonding between the second layer of material and the stationary element and between the second layer of material and the first mobile element, or sealing between the second layer of material and the stationary element by a first sealing bead and sealing between the second layer of material and the first mobile element by a second sealing bead.

20. The method according to claim 16, wherein making the first cavity and the second cavity comprises the steps of:

etching a second layer of material positioned on a second sacrificial layer itself positioned on a second substrate, forming a first portion of the second layer of material, a second portion of the second layer of material and fourth retention elements such that the second portion of the second layer of material is configured to be suspended from the first portion of the second layer of material by the fourth retention elements, transferring the second layer of material onto the stationary element and the first mobile element, such that the first portion of the second layer of material is rigidly connected to the stationary element and the second portion of the second layer of material is rigidly connected to the first mobile element, etching a portion of the second sacrificial layer through the openings passing through the second substrate, making the second portion of the second layer of material mobile with respect to the first portion of the second layer of material and the second substrate.

* * * * *